US006533903B2

(12) United States Patent
Hayward et al.

(10) Patent No.: US 6,533,903 B2
(45) Date of Patent: Mar. 18, 2003

(54) ELECTROHYDRODYNAMICALLY PATTERNED COLLOIDAL CRYSTALS

(75) Inventors: Ryan C. Hayward, Santa Barbara, CA (US); Hak F. Poon, Princeton, NJ (US); Yi Xiao, New York, NY (US); Dudley A. Saville, Princeton, NJ (US); Ilhan A. Aksay, Princeton, NJ (US)

(73) Assignee: Princeton University, Princeton, NJ (US)

( * ) Notice: Subject to any disclaimer, the term of this patent is extended or adjusted under 35 U.S.C. 154(b) by 0 days.

(21) Appl. No.: 09/843,509

(22) Filed: Apr. 26, 2001

(65) Prior Publication Data

US 2001/0035340 A1 Nov. 1, 2001

Related U.S. Application Data

(60) Provisional application No. 60/200,830, filed on Apr. 28, 2000.

(51) Int. Cl.$^7$ ................................ C07C 6/00
(52) U.S. Cl. ................................ 204/157.15
(58) Field of Search ................................ 204/157.15

(56) References Cited

U.S. PATENT DOCUMENTS

| 5,493,127 A | * | 2/1996 | Lloyd et al. | 250/573 |
| 5,855,753 A | | 1/1999 | Trau et al. | 204/484 |
| 6,251,691 B1 | * | 6/2001 | Seul | 436/534 |

OTHER PUBLICATIONS

M. Trau, D.A. Saville, L.A. Aksay, *Field–Induced Layering of Colloidal Crystals*, Science, vol. 272 (1996), pp. 706–709.

M. Trau, D.A. Saville, L.A. Aksay, *Assembly of Colloidal Crystals at Electrode Interfaces*, (1997) Langmuir 13, pp 6375–6381.

S.H. Park, Younan Xia, *Macroporous Membrances with Highly Ordered and Three Dimensionally Spherical Pores*, Advanced Materials 10 (13), (1998) pp. 1045–1048.

J.E.G.J. Wijnhoven, W.L. Vos, *Preparation of Photonic Crystals Made of Air Spheres In Titania*, Science, vol. 281, (1998), pp. 802–804.

E. Kim, Y. Xia, G. M. Whitesides, *Two– and Three–Dimensional Crystallization of Polymeric Microspheres by Micromolding in Capillaries*, Advanced Materials, 8 (3), (1997,), pp. 245–247.

S.–R. Yeh, M. Seul, B.I. Shraiman, *Assembly of Ordered Colloidal Aggregates by Electric–field–induced Fluid Flow*, Letter to Nature, vol. 386 (6), (1997), pp. 57–59.

M. Bohmer, *In Situ Observation of 2–Dimensional Clustering During Electrophoretic Deposition*, Langmuir vol. 12 (24), (1996) pp. 5747–5750.

Y. Solomentsev. M. Bohmer, J. L. Anderson, *Particle Clustering and Pattern Formation during Electrophoretic Deposition: A Hydrodynamic Model*, Langmuir 13, (1997), pp. 6058–6068.

J.E.A.M. van den Meerakker, E.A. Meulenkap, M. Scholten, (*Photo*) *Electrochemical Characterization of* Tin–doped Indium Oxide, J. of Applied Physics 74 (5), (1993), pp. 3282–3288.

S.R. Morrison, *Electrochemistry at Semiconductor and Oxidized Metal Electrodes*: New York: Plenum Press (1980), pp. 1–401.

* cited by examiner

*Primary Examiner*—Edna Wong
(74) *Attorney, Agent, or Firm*—RatnerPrestia

(57) ABSTRACT

A method for assembling patterned crystalline arrays of colloidal particles using ultraviolet illumination of an optically-sensitive semiconducting anode while using the anode to apply an electronic field to the colloidal particles. The ultraviolet illumination increases current density, and consequently, the flow of the colloidal particles. As a result, colloidal particles can be caused to migrate from non-illuminated areas of the anode to illuminated areas of the anode. Selective illumination of the anode can also be used to permanently affix colloidal crystals to illuminated areas of the anode while not affixing them to non-illuminated areas of the anode.

7 Claims, 2 Drawing Sheets

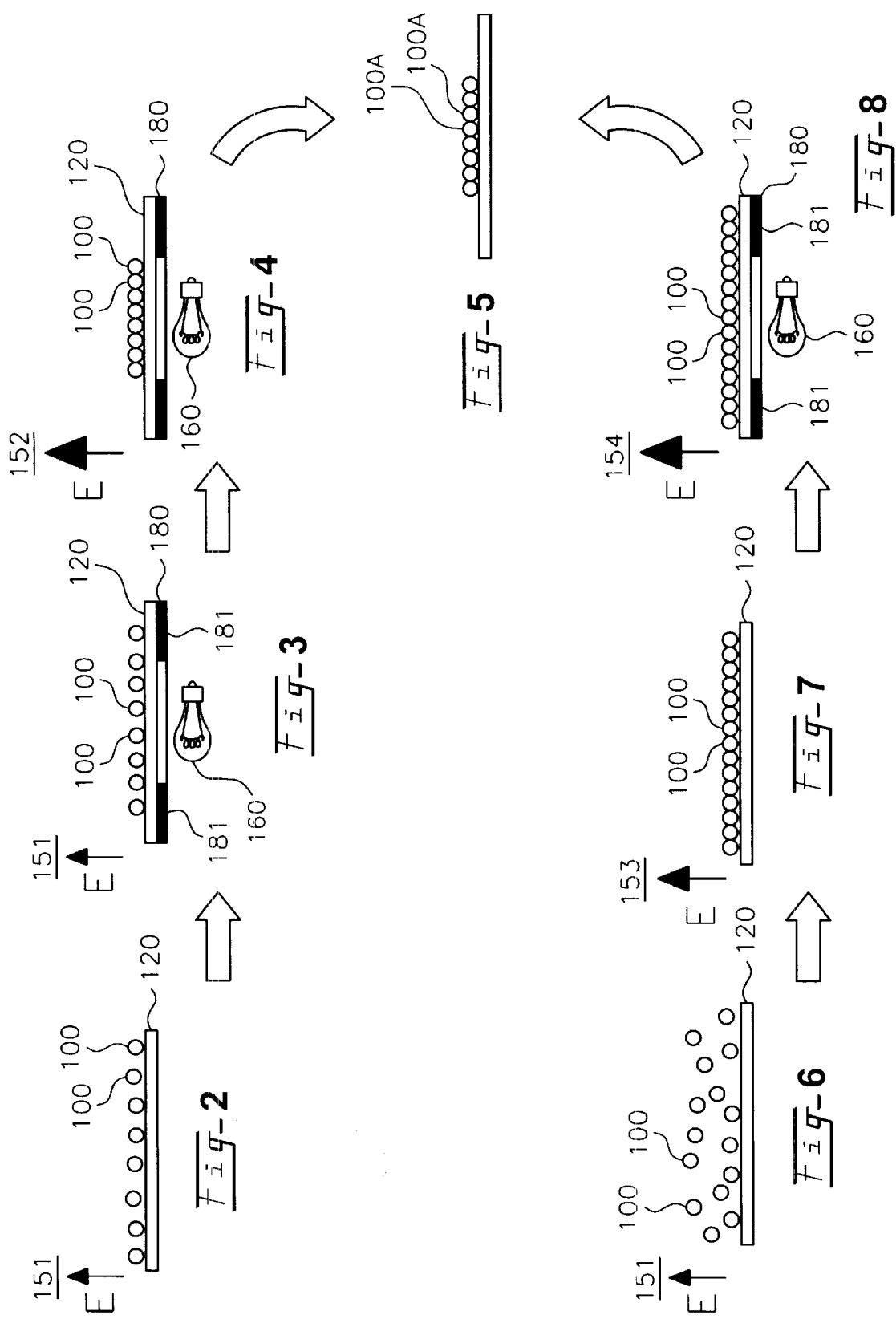

ELECTROHYDRODYNAMICALLY PATTERNED COLLOIDAL CRYSTALS

CROSS REFERENCE TO RELATED APPLICATIONS

The present application claims the priority of U.S. Provisional Patent Application No. 60/200,830 filed on Apr. 28, 2000, which is pending and is assigned to the assignee of the present application.

GOVERNMENTAL RIGHTS

The present invention has been made under a contract with or using funding from the United States Army, NSF-MERSEC, and the Microgravity Science and Applications Division of NASA. The government may have certain rights to the subject invention.

TECHNICAL FIELD

This invention relates generally to assembly of patterned crystalline arrays of colloidal particles, and more specifically to using electromagnetic radiation to electrohydrodynamically assemble patterned crystalline arrays of colloidal particles.

BACKGROUND OF THE INVENTION

The arrangement of colloidal particles in a crystalline array has a variety of potential applications. Immediate possibilities include, but are not limited to the production of a template for photonic band-gap material with two-dimensional channels, biological and chemical sensors (by functionalizing the surfaces of the colloidal particles), micro-chip reactors, and high-density data storage devices. Many additional uses may be realized in the future.

A variety of techniques have been attempted for the production of crystalline arrays of colloidal particles. However, only a few of these techniques have the ability to produce two-dimensional patterns. Those techniques that can produce two-dimensional patterns have other limitations.

A technique for assembling colloidal particles into a crystalline array by the application of an electric field was reported by Richetti et al., Journal of Physics Letters 45, 1137–1143 (1984). Although the details of the assembly mechanism are not fully understood, the process involves simple coulombic interactions which bring particles close to an electrode surface, together with lateral motion stemming from electrohydrodynamic or electroosmotic effects. Once the particles are close to the surface of the electrode, where they remain mobile, electrohydrodynamic or electrokinetic processes assemble them into crystalline arrays. Particles can be permanently attached to the electrode surface by increasing the attractive force between the particles and the electrode. When the attractive forces exceed the force of steric repulsion, entry into the "primary minimum" creates a permanent bond.

Trau et al. (U.S. Pat. No. 5,855,753) teach a method for patterning a crystalline array of colloidal particles by altering the surface topography of the electrode in a electrolytic cell, and is incorporated herein by reference. The variations in surface topography cause nonuniform current density that affects the motion of particles near the electrode surface. Charged colloidal particles have a tendency to migrate toward areas of greater current density and increased current density can also cause the particles to assemble in crystalline arrays and become fixed to the electrode. However, this process has the disadvantage of added time and expense for lithography and etching processes. Also dimensional errors are introduced in the crystalline array due to lithography and etching process tolerances. Nor can this method be used for forming patterns of colloidal particles comprising different material or having different funtionalization.

G. M. Whitesides et al. (Advanced Materials 10 (13) 1045–1048 (1998) teach an alternative method for assembling patterned colloidal crystals. The presence of capillary forces in a microcontact printing mold draws a suspension of colloidal particles into small channels above the substrate, and evaporation of solvents allows the colloidal particles to self-assemble into colloidal crystals. This method eliminates the need to etch or otherwise alter the substrate. However, the reliance on capillary flow restricts this method to patterns consisting of interconnecting areas. A continuous channel for fluid flow must connect every part of the pattern to the edge.

A need still exists for a method for assembling patterned crystalline arrays of colloidal particles and affixing them to an electrode without physical modification of the electrode surface or the colloidal crystal and wherein the pattern of colloidal crystals does not have to be interconnected. It is an object of the present invention to provide a method for assembling patterned colloidal crystals using selective illumination of an optically-sensitive electrode with electromagnetic radiation. It is a further object of the present invention to provide a flexible process for forming patterned colloidal crystals.

SUMMARY OF THE INVENTION

To achieve these and other objectives, and in view of its purposes, the present invention provides a method for electrohydrodynamically assembling colloidal particles into a patterned crystalline assembly and permanently affixing the crystalline assembly to an electrode by selectively illuminating an electrode consisting of optically-sensitive semiconducting material with electromagnetic radiation while using the electrode to apply an electric field to the colloidal particles.

In one embodiment of the present invention, a method is provided for forming a patterned crystalline assembly of colloidal particles by illuminating selected areas of a semiconducting electrode with electromagnetic radiation while using the electrode to apply an electric field to the colloidal particles. The intensity of the electric field or the electromagnetic radiation or both can be modulated over time to enhance migration and assembly of the colloidal particles and to permanently affix the crystalline assembly of colloidal particles to the electrode.

It should be understood that both the foregoing general description and the following detailed description are exemplary, but are not restrictive, of the invention.

BRIEF DESCRIPTION OF THE DRAWINGS

The features and advantages of a method for forming patterned crystalline arrays of colloidal particles using electromagnetic radiation to selectively illuminate an optically-sensitive semiconducting electrode will be more clearly understood from the following description when read in connection with the accompanying drawing. Included in the drawing are the following figures:

FIG. 2 shows colloidal particles being brought close to an electrode surface by an electric field;

FIG. 3 shows the electrode being selectively illuminated by electromagnetic radiation through an optical mask causing the colloidal particles to migrate to the area of the electrode that is illuminated by electromagnetic radiation;

FIG. 4 shows an increased electric field strength due to modulation of the applied potential or the intensity of the electromagnetic radiation or both, causing the colloidal particles to affix to the electrode;

FIG. 5 shows the patterned crystalline array of colloidal particles, permanently affixed to the electrode;

FIG. 6 shows colloidal particles being exposed to an electric field from an ITO anode;

FIG. 7 shows the colloidal particles being assembled into a crystalline array by an intermediate intensity electric field;

FIG. 8 shows a strong electric field and selective illumination of the ITO anode, causing the colloidal particles to affix to the ITO anode only at the illuminated areas;

DETAILED DESCRIPTION OF THE INVENTION

Figure 1:
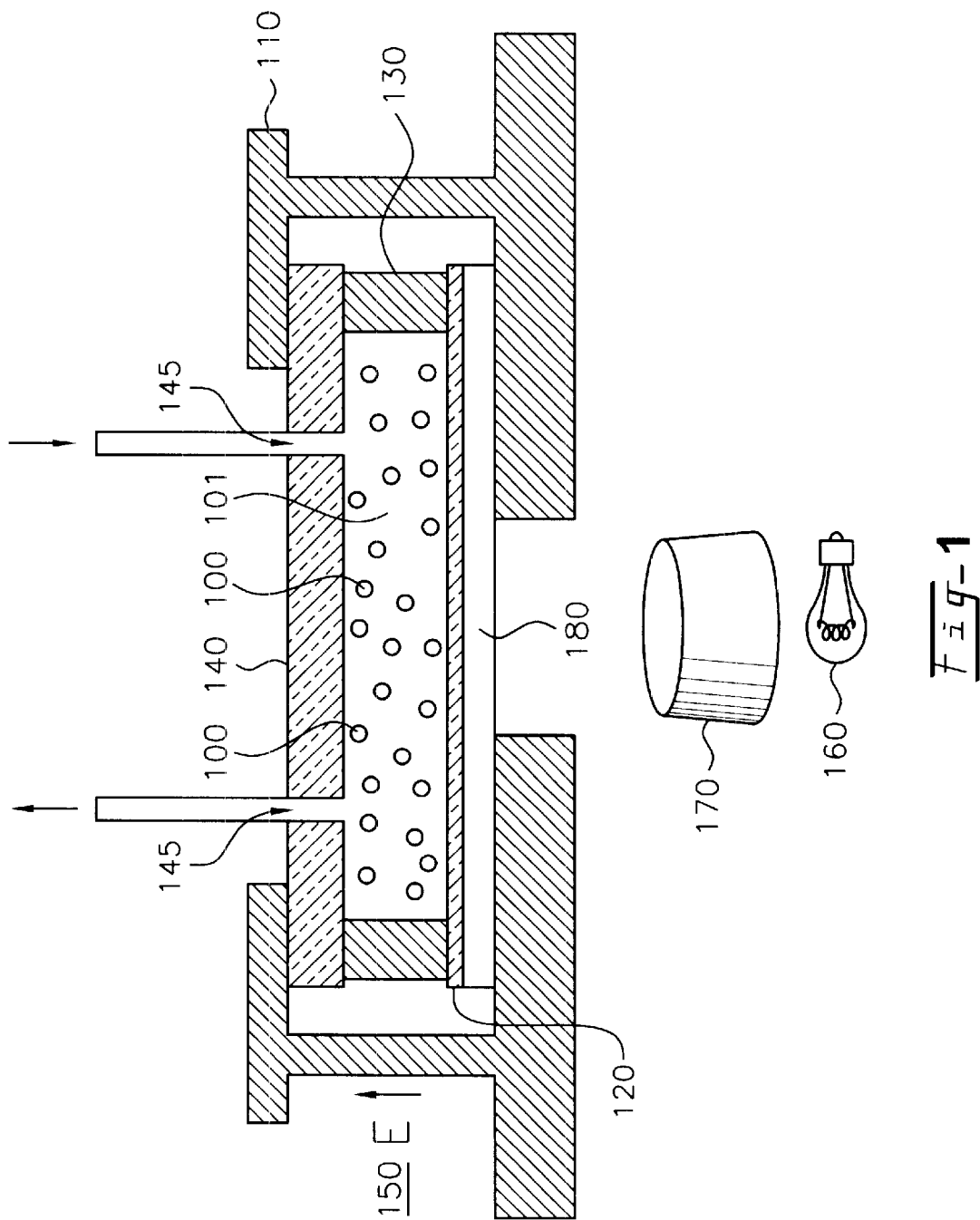
FIG. 1 is a sectional view of a set-up for migrating, assembling and affixing colloidal particles into a crystalline array by illuminating the anode of an electrolytic cell with electromagnetic radiation while using the anode to apply an electric field to the colloidal particles according to one embodiment of the invention.

The present invention will be described in detail with reference to the accompanying drawing in which like reference numerals designate similar or corresponding elements, regions, and portions. The present invention provides a method for electrohydrodynamically assembling colloidal particles into a patterned crystalline assembly and permanently affixing the crystalline assembly to an electrode by selectively illuminating an electrode consisting of optically-sensitive semiconducting material with electromagnetic radiation while using the electrode to apply an electric field to the colloidal particles.

Referring now to FIG. 1, a set-up is shown for migrating, assembling, and affixing colloidal particles (100) into a crystalline array according to one embodiment of the present invention. Colloidal particles (100) should be understood to comprise any of a wide variety of materials that are electrostatically stabilized, including, but not limited to silica, polystyrene, gold, and brass. The colloidal particles (100) can have varying shapes and are of such size as can be suspended in a fluid (101) in a stable state. Typically diameters are in the nanometer range. The fluid (101) according to the present invention can be any of a various ionically conductive fluids, including, but not limited to water with various salts dissolved therein.

A fixture (110) is provided to stage and clamp an electrolytic cell. Structurally, the electrolytic cell comprises: an anode (120) on the bottom of the cell, a spacer (130) over the anode (120), and a cathode (140) over the spacer (130). The cathode (140) has openings (145) through which fluids and colloidal particles can be introduced and removed. An electrolytic cell is formed when an ionically conducting fluid (101) is introduced between the anode (120) and the cathode (140) and an electric field (150) is created by applying a potential between the anode and the cathode. The fluid (101) is contained by the spacer (130).

To form crystalline colloidal arrays, colloidal particles (100) are suspended in the ionically conducting fluid (101), and the resulting colloidal suspension is introduced between the anode (120) and the cathode (140). As described by Trau (U.S. Pat. No. 5,855,753), an electric field can be used to induce a lateral attraction between similarly charged colloidal particles causing the colloidal particles to assemble into a two-dimensional crystalline array. By creating spatial variation in the intensity of the electrical field, colloidal particles can be caused to migrate to areas of greater electric field strength. Using a weak electrical field, colloidal particles can be drawn to the anode surface while maintaining lateral mobility. By progressively increasing the intensity of the electric field the colloidal particles can be assembled into crystalline arrays, then fixed to the anode surface.

In one embodiment of the present invention, the electric field is enhanced by the application of electromagnetic radiation to the anode (120) where the anode comprises an optically sensitive semiconducting material. For example, the anode may comprise Indium Tin Oxide (ITO) which undergoes a photochemical effect when exposed to electromagnetic radiation at wavelengths below its bandgap (i.e., ultraviolet (UV) light). It should be understood that other semiconducting material, possibly exposed to electromagnetic radiation at different wavelengths, is within the scope of this invention. The electromagnetic radiation can be provided by a light source (160) which illuminates the surface of the anode (120) opposite the colloidal suspension.

Selective illumination of the semiconducting ITO anode (120) with UV light increases the rate of charge transfer between suspension and electrode at the illuminated areas through a photochemical effect, thereby producing spatial variations in current density and, consequently, the field strength in the electrolytic cell. These variations are used to induce particle migration. The colloidal particles migrate from areas of lower field strength to areas of higher field strength, provided the field strength is low enough to allow two-dimensional motion (i.e., below the field strength at which the colloidal particles become fixed to the anode).

As the field strength is increased, the colloidal particles assemble into crystalline arrays, then at a still higher field strength, the colloidal particles freeze to the surface of the anode. The field strength can be increased by modulating the applied potential between the anode and cathode of the electrolytic cell, by increasing the intensity of the electromagnetic radiation illuminating the anode, or both. Optionally, the UV light can be focused on the anode (120) using a microscope objective (170), as shown in FIG. 1.

UV light can also be used to assemble colloidal particles into patterned crystalline arrays. By selectively illuminating an ITO anode with UV light, colloidal particles can be migrated to illuminated areas. The colloidal particles are swept from the non-illuminated areas into the illuminated areas. The field strength can then be modified by adjusting the potential applied to the electrolytic cell, the intensity of the illumination, or both. The increased field strength will assemble the colloidal particles into a crystalline array, then fix the crystalline array to the anode. Since the field strength is greater at the illuminated areas of the anode, colloidal particles can be fixed to the anode in the illuminated areas without fixing particles to the non-illuminated areas. By using electromagnetic radiation to enhance the field strength at the illuminated areas of the anode to affix the colloidal crystal to the anode, the field strength at non-illuminated areas can be kept low enough to prevent stray colloidal particles from affixing to the anode.

One approach to selective illumination of specific areas of the anode with electromagnetic radiation is to use an optical mask (180) that prevents transmission of electromagnetic radiation such as UV light in areas where colloidal crystals, and therefore illumination, are not desired, while transmitting the electromagnetic radiation where colloidal crystals are desired. Optical masks are well known in the art of photolithography and can be formed with light absorbing ink on acetate film, for example. Alternatively, selected areas of the anode can be illuminated by directing a focused beam of light to the areas to be illuminated (e.g., laser writing). Also, interference patterns can be created to produce a pattern of varying intensity electromagnetic radiation using diffraction of the electromagnetic radiation.

Embodiment A

Referring to FIGS. 2–5, UV light is used to selectively assemble colloidal particles into a patterned crystalline array and affix the patterned colloidal crystal to an ITO anode. A suspension of colloidal particles (100) is introduced into an electrolytic cell having an ITO anode (120). The colloidal particles (polystyrene with a diameter of about 2 micrometers, for example) are at a concentration just sufficient to cover the anode surface with a monolayer of particles. The colloidal particles are exposed to a weak electric field (151), without illumination, by applying a voltage potential between the anode (120) and a cathode (not shown). The weak electric field (151) is just strong enough to draw the colloidal particles to the anode (120) while still allowing lateral motion of the colloidal particles (100). In a dielectric cell with a gap of about 500 micrometers and a fluid conductivity of about 30–100 $\mu$S/cm, the weak electric field can be achieved with a dc voltage potential of between about 1.0 volts and 1.4 volts for a time of about 30 minutes.

After the colloidal particles have been drawn to the anode surface, the anode is selectively illuminated with UV light, while the weak electric field (151) continues to be applied to the colloidal particles (100), as shown in FIG. 3. The anode, which comprises an optically sensitive semiconducting material, such as Indium Tin Oxide, is selectively illuminated by placing an optical mask (180) between a light source (160) and the surface of the anode opposite the colloidal particles. The optical mask (180) may comprise a transparent acetate film with an ink pattern (181) thereon that does not transmit UV light. Areas of the anode (120) covered by transparent portions of the mask are illuminated, and areas covered by the portions of the mask printed with the ink pattern (181) are not illuminated.

Illumination of selected areas of the ITO anode (120) causes a spatial variation in the intensity of the electric field acting on the colloidal particles. The variation is believed to be the result of a photochemical effect caused by an interaction between UV light and the electronic band structure of ITO. ITO is a heavily doped n-type semiconductor with as bandgap of between 3.5 and 4.3 eV, depending on its composition and method of preparation. The ITO anode is opaque to light at wavelengths below 310 nanometers and transmits between 70% and 90% of electromagnetic radiation above 400 nanometers in wavelength. Illumination of the ITO anode by UV light results in a small increase in current through the electrolytic cell when a constant voltage is applied. Illumination of selected areas of the ITO anode causes an increase in current at the illuminated areas of the ITO anode as compared to non-illuminated areas. The increased current is due to a redox reaction of water which forms hydrogen and oxygen at the electrodes, as taught by Trau et al. (U.S. Pat. No. 5,855,753). The increase in current upon illumination of the ITO anode is believed to be a result of hole-electron pair generation at the ITO/water interface and migration of the hole-electron pairs. Electrons at the ITO surface are at a higher energy level than those in the bulk electrolytic fluid, because they are surrounded by fewer metal cations. When an electron-hole pair is created near the electrode surface via absorption of a photon, the promoted electron lowers its energy by moving away from the surface. Correspondingly, the new hole in the valence band moves toward the surface, where it becomes available for surface reactions. This process increases the rate of charge transfer between solution and electrode and, therefore, the current density within the cell. Colloidal particles are swept into regions of higher current density. Consistent with electrohydrodynamic and electroosmotic theory, colloidal particle movement increases with increased current density and field strength. Illumination of the ITO anode with UV light enhances colloidal particle migration, because it causes an increase in current density.

After the colloidal particles (100) assemble into a crystalline array, the field intensity in the electrolytic cell is increased to a strong electric field (152), while the ITO anode (120) continues to be illuminated by UV light as shown in FIG. 4. The strong electric field and the illumination cause the crystalline arrays of colloidal particles to permanently affix to the ITO anode (120). In a dielectric cell with a gap of about 500 micrometers and a fluid conductivity of about 30–100 $\mu$S/cm, a strong electric field capable of permanently firing colloidal crystals to the ITO anode can be achieved with a dc voltage potential of between about 2.0 and 3.0 volts for a time of about 45 minutes. When the light source and voltage potential are removed, a patterned colloidal crystal (100A) remains permanently attached (e.g., affixed) to the ITO anode (120), as shown in FIG. 5.

Embodiment B

FIGS. 6–9 show a method for assembling colloidal crystals using UV light to affix the crystals to an ITO anode. As shown in FIG. 6, a weak electric field (151) is applied to colloidal particles (100) in an electrolytic suspension by applying a voltage potential between an ITO anode (120) and a brass cathode (not shown). The weak current draws the colloidal particles (100) to the surface of the ITO anode (120) while allowing lateral mobility. The weak electric field can be formed using a voltage of between about 0.9 volts and 1.3 volts. In this embodiment, no illumination is used with the weak electric field (151).

After the colloidal particles have collected on the surface of the ITO anode (120), the field intensity is increased to an intermediate strength field (153) as shown in FIG. 7. At the intermediate field strength, the colloidal particles (100) assemble into a crystalline array, but do not become affixed to the ITO anode (120). In a dielectric cell with a gap of about 500 micrometers and a fluid conductivity of about 30–100 $\mu$S/cm, the intermediate electric field (153) can be achieved with a dc voltage potential of between about 1.3 volts and 1.7 volts. Crystalline arrays can be assembled without illumination in a time of about 10 minutes in this embodiment.

Then, as shown in FIG. 8, the field intensity in the electrolytic cell is increased to a strong electric field (154), and the ITO anode (120) is selectively illuminated by UV light. The ITO anode (120), which comprises an optically sensitive semiconducting material, is selectively illuminated by placing an optical mask (180) between a light source (160) and the surface of the anode opposite the colloidal particles. The optical mask (180) may comprise a transparent acetate film with an ink pattern (181) thereon that does not transmit UV Light. Area of the anode (120) covered by transparent portions of the mask are illuminated, and area covered by the portions of the mask printed with the ink pattern (181) are not illuminated. It should be noted that the colloidal assemble into crystalline arrays uniformly over the surface of the ITO anode in this embodiment, because they were assembled without using UV light.

Illumination of selected areas of the ITO anode (120) causes a spatial variation in the intensity of the current density—being higher at the illuminated areas of the ITO anode than at the non-illuminated areas of the ITO anode. An increased current implies a greater potential drop across the electrolyte, so the electric field in the bulk electrolyte is stronger. As illumination increases the field strength, the colloidal particles in the illuminated regions are more strongly attracted to the surface of the ITO anode (120).

By controlling the voltage potential across the electrolyte and the intensity of the UV light, the colloidal crystal can be selectively affixed to the ITO anode surface. Colloidal crystals are permanently affixed to the ITO anode at the illuminated areas without being affixed at the non-illuminated areas.

In a dielectric cell with a gap of about 500 micrometers and a fluid conductivity of about 30–100 $\mu$S/cm, a strong electric field capable of permanently affixing colloidal crystals to the ITO anode at illuminated areas without affixing colloidal crystals at non-illuminated areas can be achieved with a dc voltage potential of between about 2.0 volts and 3.0 volts for a time of about 45 minutes and illumination with ultraviolet light of sufficient intensity to increase the current density by about 20% to 40% in the illuminated regions. When the light source and voltage potential are removed, a patterned colloidal crystal (100A) remains permanently attached to the ITO anode (120), as shown in FIG. 5.

Embodiment C

Colloidal crystals assembled using UV light can be subjected to an AC potential with a DC offset to densify the crystalline structure and induce grain growth. For example, an AC potential of between about 200 mV and 500 mV amplitude and a frequency of between about 0.5 Hz and 2.0 Hz with a DC offset of between about 900 mV and 950 mV can cause colloidal particles at the edge of a crystalline array to have sufficient mobility to rearrange. Colloidal particles can be rearranged after they held to the substrate and before they are affixed to it. The time scale of the changes in field strength (about 2 seconds) is significantly less than the characteristic time scale of formation/disintegration of colloidal crystals (on the order of 10 seconds). This difference allows the particles at the edge of the crystal to rearrange without the particles in the bulk of the crystal rearranging significantly. As a result, growth and densification of two-dimensional crystal structures are enhanced.

In one embodiment, the colloidal particles are exposed to a first voltage potential of between about 0.9 and 0.95 vdc with no alternating current, followed by a second voltage potential of between about 0.9 vdc and 1.2 vdc with an alternating current of between about 200 mV and 500 mV at a frequency of between about 0.5 Hz and 2.0 Hz, then a third voltage potential of between about 2.0 vdc and 3.0 vdc with an alternating current of between about 0 mV and 500 mV at a frequency of between about 0.5 Hz and 2.0 Hz. The first voltage potential draws the colloidal particles to the substrate. The second voltage potential arranges the colloidal particles into a crystalline array where the alternating current with a dc offset densifies the crystalline array. Then, the third voltage affixes the crystalline array of colloidal particles to the substrate.

What is claimed is:

1. A method for enhancing migration and assembly of colloidal particles into a crystalline assembly comprising the step of selectively illuminating an electrode comprising optically sensitive semiconducting material with electromagnetic radiation while applying an alternating current potential with a direct current offset to the electrode to apply an electric field to the colloidal particles.

2. A method for assembling colloidal particles into a patterned crystalline assembly comprising the steps of:

introducing colloidal particles suspended in a fluid between an anode and a cathode, the anode comprising an optically sensitive semiconducting material;

applying a first voltage potential between the anode and the cathode to provide a weak electric field drawing the colloidal particles to the anode while allowing lateral mobility of the colloidal particles;

selectively illuminating the anode with electromagnetic radiation, thereby causing the colloidal particles to migrate to the illuminated areas of the anode assembling the colloidal particles into a patterned crystalline array;

increasing the voltage potential between the anode and cathode to a second voltage potential to provide a strong electric field permanently affixing the patterned crystalline array to the anode; and removing the voltage potential and the electromagnetic radiation;

wherein the first and second voltage potentials are alternating current potentials of between about 200 mV and 500 mV volts at a frequency of between about 0.5 Hz and 2.0 Hz with a direct current offset of between about 900 mV and 950 mV.

3. A method of affixing colloidal particles into a patterned crystalline assembly comprising the steps of:

introducing colloidal particles suspended in a fluid between an anode and a cathode; the anode comprising an optically sensitive semiconducting material;

applying a first voltage potential between the anode and the cathode to provide a weak electric field drawing the colloidal particles to the anode while allowing lateral mobility of the colloidal particles;

increasing the voltage potential between the anode and cathode to a second voltage potential to provide an intermediate strength electric field assembling the colloidal particles into a patterned crystalline array;

increasing the voltage potential between the anode and cathode to a third voltage potential to provide a strong electric field and selectively illuminating the anode with electromagnetic radiation permanently affixing a patterned crystalline array to the anode at the illuminated areas; and removing the voltage potential and the electromagnetic radiation;

wherein the first voltage potential is between about 0.9 vdc and 0.95 vdc with no alternating current, the second voltage potential is between about 0.9 vdc and 1.2 vdc with an alternating current of between about 200 mV and 500 mV at a frequency of between 0.5 Hz and 2.0 Hz, and third voltage potential is between about 2.0 vdc and 3.0 vdc with an alternating current of between about 0 and 500 mV at a frequency of between about 0.5 Hz and 2.0 Hz.

4. A method for assembling colloidal particles into a patterned crystalline assembly comprising the step of illuminating a semiconducting electrode with electromagnetic radiation while using the electrode to apply an electric field to the colloidal particles, wherein a diffraction pattern is used to produce periodic variation in intensity of the electromagnetic radiation, causing the colloidal particles to migrate into a pattern corresponding to the intensity of the electromagnetic radiation.

5. The method of claim 4 which further comprises the step of modulating the intensity of the electromagnetic radiation to permanently affix the colloidal particles to the electrode surface in the illuminated areas.

6. The method of claim 4 which further comprises the step of modulating the intensity of the electric field to permanently affix the colloidal particles to the electrode surface in the illuminated areas.

7. The method of claim 4 which further comprises the step of modulating the intensity of the electromagnetic radiation and the electric field to permanently affix the colloidal particles to the electrode in the illuminated areas.

\* \* \* \* \*